US012708000B2

(12) United States Patent
Yu et al.

(10) Patent No.: US 12,708,000 B2
(45) Date of Patent: Aug. 11, 2026

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chen-Hua Yu, Hsinchu City (TW); Kai-Chiang Wu, Hsinchu City (TW); Chun-Lin Lu, Hsinchu City (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 18/518,471

(22) Filed: Nov. 23, 2023

(65) Prior Publication Data

US 2024/0088053 A1 Mar. 14, 2024

Related U.S. Application Data

(62) Division of application No. 17/530,868, filed on Nov. 19, 2021, now Pat. No. 11,854,992, which is a (Continued)

(51) Int. Cl.

*H10W 70/60* (2026.01)
*H10W 70/09* (2026.01)
(Continued)

(52) U.S. Cl.

CPC ......... *H10W 70/614* (2026.01); *H10W 70/09* (2026.01); *H10W 70/60* (2026.01); *H10W 70/611* (2026.01); *H10W 70/635* (2026.01); *H10W 70/65* (2026.01); *H10W 70/685* (2026.01); *H10W 74/016* (2026.01); *H10W 74/017* (2026.01); *H10W 74/117* (2026.01); *H10W 74/121* (2026.01); *H10W 74/129* (2026.01); *H10W 90/00* (2026.01); *H10W 70/63* (2026.01); *H10W 72/241* (2026.01); *H10W 72/874* (2026.01); *H10W 72/9413* (2026.01);
(Continued)

(58) Field of Classification Search

None

See application file for complete search history.

(56) References Cited

U.S. PATENT DOCUMENTS 9,048,222 B2 6/2015 Hung et al.
9,048,233 B2 6/2015 Wu et al.
(Continued)

*Primary Examiner* — Khaja Ahmad
(74) *Attorney, Agent, or Firm* — Slater Matsil, LLP

(57) ABSTRACT

A semiconductor structure includes a first dielectric layer, a first die, a second die, a first molding, and a second molding. The first die is disposed under the first dielectric layer, and has a first surface facing the first dielectric layer and a second surface opposite to the first surface. The second die is disposed over the first dielectric layer, and has a third surface facing the first dielectric layer and a fourth surface opposite to the third surface. The first molding encapsulates the first die. The second molding is disposed over the first die and the first dielectric layer. The first surface of the first die and the third surface of the second die are in contact with the first dielectric layer. The fourth surface of the second die is partially exposed through the second molding and partially covered by the second molding.

20 Claims, 19 Drawing Sheets

Related U.S. Application Data division of application No. 16/736,464, filed on Jan. 7, 2020, now Pat. No. 11,183,461, which is a division of application No. 15/459,691, filed on Mar. 15, 2017, now Pat. No. 10,529,666.

(60) Provisional application No. 62/427,651, filed on Nov. 29, 2016.

(51) Int. Cl.

| | |
|---|---|
| ***H10W 70/63*** | (2026.01) |
| ***H10W 70/65*** | (2026.01) |
| ***H10W 70/685*** | (2026.01) |
| ***H10W 72/00*** | (2026.01) |
| ***H10W 72/20*** | (2026.01) |
| ***H10W 72/90*** | (2026.01) |
| ***H10W 74/01*** | (2026.01) |
| ***H10W 74/10*** | (2026.01) |
| ***H10W 74/15*** | (2026.01) |
| ***H10W 80/00*** | (2026.01) |
| ***H10W 90/00*** | (2026.01) |

(52) U.S. Cl.

CPC .......... *H10W 74/019* (2026.01); *H10W 74/15* (2026.01); *H10W 80/211* (2026.01); *H10W 90/724* (2026.01); *H10W 90/794* (2026.01)

(56) References Cited

U.S. PATENT DOCUMENTS

| | | | | |
|---|---|---|---|---|
| 9,064,874 | B2 | 6/2015 | Edelstein et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 2006/0123613 | A1 | 6/2006 | Thomas | |
| 2006/0126313 | A1* | 6/2006 | Steiner | H10W 72/20 257/E23.021 |
| 2008/0272477 | A1 | 11/2008 | Do et al. | |
| 2009/0176348 | A1* | 7/2009 | Griffiths | H01L 25/0657 257/E21.583 |
| 2010/0207140 | A1 | 8/2010 | Rudaz et al. | |
| 2011/0210444 | A1 | 9/2011 | Jeng et al. | |
| 2013/0075937 | A1 | 3/2013 | Wang et al. | |
| 2013/0208426 | A1* | 8/2013 | Kim | H10W 40/10 361/717 |
| 2013/0292846 | A1* | 11/2013 | Lee | H01L 23/5384 257/774 |
| 2013/0341786 | A1 | 12/2013 | Hsu et al. | |
| 2014/0091471 | A1* | 4/2014 | Chen | H01L 23/49838 257/770 |
| 2014/0103488 | A1 | 4/2014 | Chen et al. | |
| 2014/0103527 | A1 | 4/2014 | Marimuthu et al. | |
| 2014/0185264 | A1* | 7/2014 | Chen | H01L 23/3128 361/814 |
| 2014/0217610 | A1 | 8/2014 | Jeng et al. | |
| 2015/0171024 | A1 | 6/2015 | Choi et al. | |
| 2015/0171028 | A1* | 6/2015 | Jo | H01L 25/0657 257/713 |
| 2015/0194583 | A1 | 7/2015 | Sabathil et al. | |
| 2015/0255426 | A1 | 9/2015 | Son et al. | |
| 2015/0303174 | A1 | 10/2015 | Yu et al. | |
| 2015/0318255 | A1 | 11/2015 | Karhade et al. | |
| 2015/0364445 | A1 | 12/2015 | Choi et al. | |
| 2016/0260684 | A1* | 9/2016 | Zhai | H10W 74/019 |
| 2016/0260695 | A1 | 9/2016 | Chung et al. | |
| 2016/0307815 | A1 | 10/2016 | Huang et al. | |
| 2017/0077022 | A1 | 3/2017 | Scanlan et al. | |
| 2017/0179078 | A1 | 6/2017 | Jung et al. | |
| 2018/0047571 | A1 | 2/2018 | Hunt et al. | |

* cited by examiner

SEMICONDUCTOR STRUCTURE AND MANUFACTURING METHOD THEREOF

PRIORITY CLAIM AND CROSS-REFERENCE

This patent is a divisional application of U.S. patent application Ser. No. 17/530,868, filed on Nov. 19, 2021, entitled of "SEMICONDUCTOR STRUCTURE AND MANUFACTURING METHOD THEREOF", which is a divisional application of U.S. patent application Ser. No. 16/736,464, filed on Jan. 7, 2020, entitled of "SEMICONDUCTOR STRUCTURE AND MANUFACTURING METHOD THEREOF", now U.S. Pat. No. 11,183,461 B2, which is a divisional application of U.S. patent application Ser. No. 15/459,691 filed on Mar. 15, 2017, entitled of "SEMICONDUCTOR STRUCTURE AND MANUFACTURING METHOD THEREOF", now U.S. Pat. No. 10,529,666 B2, which claims priority to U.S. Provisional Application No. 62/427,651 filed on Nov. 29, 2016, entitled "SEMICONDUCTOR STRUCTURE AND MANUFACTURING METHOD THEREOF"; each of these applications are incorporated herein by reference in their entireties.

BACKGROUND

Electronic equipment using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor structural configuration, delamination of components, or other issues, resulting in a high yield loss of the semiconductor device and increase of manufacturing cost. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
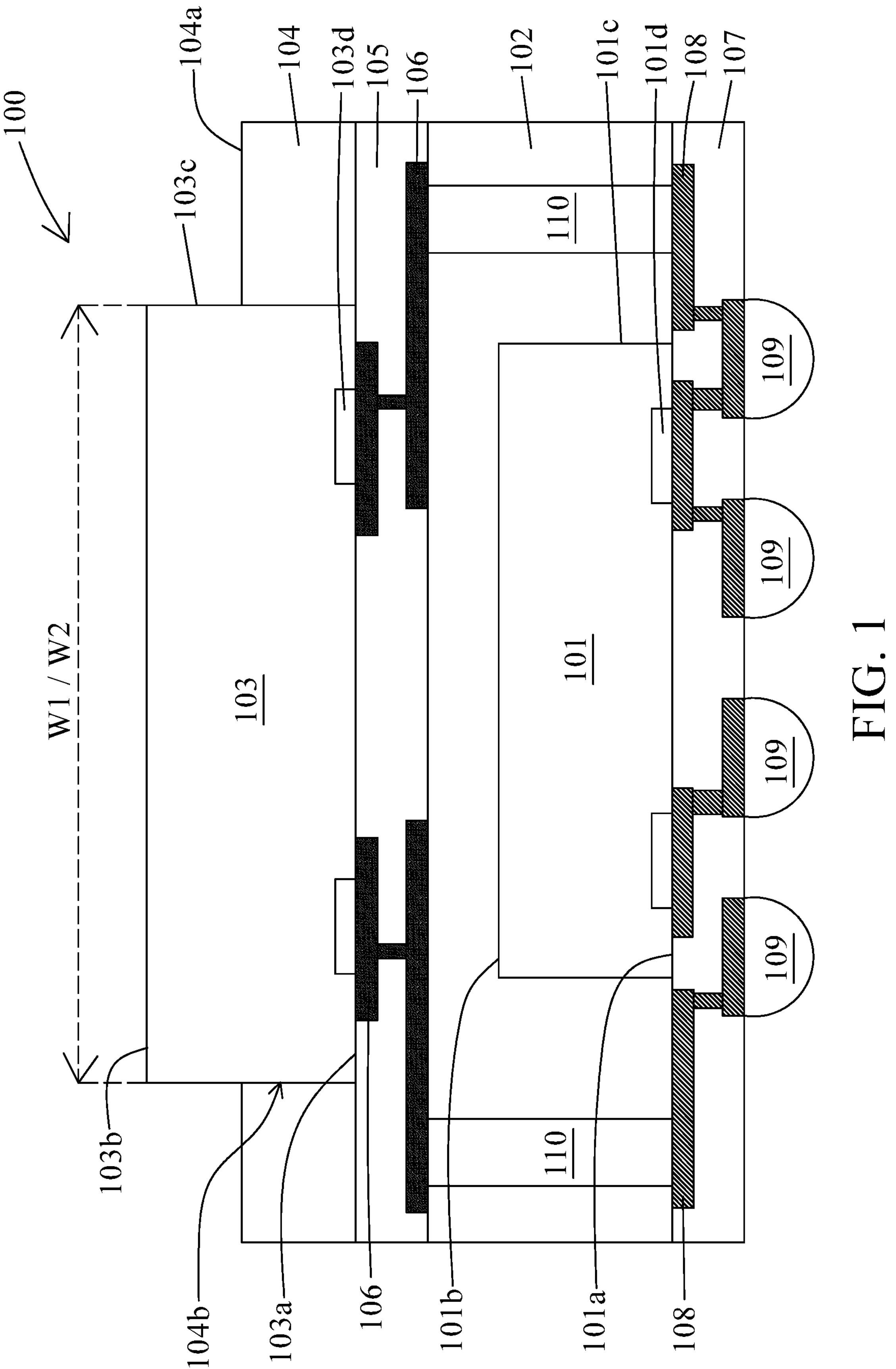
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A die is fabricated and singulated from a semiconductive wafer. After singulation, the die is packaged to become a semiconductor package and integrated with another die or package. The die is encapsulated by a molding, and I/O terminals of the die are routed out through conductive lines disposed within a dielectric layer, and the die is electrically connected to another dies or packages by a via extending through the molding. The dies or packages are encapsulated by molding. However, such configuration may not be suitable for dies or packages which are configured for sensing purpose or configured as a sensor. For example, a die or a package is required to be partially or entirely exposed from the molding in order to perform the sensing function.

In the present disclosure, a semiconductor structure with improvement is disclosed. The semiconductor structure includes a die (or a package) at least partially exposed from a molding. A predetermined portion of a surface of the die or a predetermined surface of the die is exposed from the molding in accordance with design requirements. A design of a mold chase is modified in order to form the molding which exposes at least a portion or a surface of the die. Therefore, the die with exposed portion or exposed surface facilitates predetermined sensing function.

FIG. 1 is a schematic cross sectional view of a semiconductor structure 100 in accordance with various embodiments of the present disclosure. In some embodiments, the semiconductor structure 100 includes a first die 101, a first molding 102, a second die 103 and a second molding 104. In some embodiments, the semiconductor structure 100 is a semiconductor package. In some embodiments, the semiconductor structure 100 is an integrated fan out (InFO) package, where I/O terminals of the first die 101 are fanned out and redistributed over a surface of the first die 101 in a greater area. In some embodiments, the semiconductor structure 100 is configured to perform sensing function.

In some embodiments, the first die 101 is fabricated with a predetermined functional circuit within the first die 101. In some embodiments, the first die 101 is singulated from a semiconductive wafer by a mechanical or laser blade. In some embodiments, the first die 101 comprises a variety of electrical circuits suitable for a particular application. In some embodiments, the electrical circuits include various devices such as transistors, capacitors, resistors, diodes and/or the like.

In some embodiments, the first die 101 comprises of any one of various known types of semiconductor devices such as memories (such as SRAMS, flash memories, etc.), microprocessors, application-specific integrated circuits (ASICs), or the like. In some embodiments, the first die 101 is a logic device die, central computing unit (CPU) die, or the like. In some embodiments, the first die 101 is a system on chip (SOC) that integrates all electronic components into a single die. In some embodiments, the first die 101 is a die, a chip or a package. In some embodiments, the first die 101 has a top cross section (a cross section from the top view of the semiconductor structure 100 as shown in FIG. 1) in a quadrilateral, a rectangular or a square shape.

In some embodiments, the first die 101 includes a substrate which comprises semiconductive materials such as silicon. In some embodiments, the substrate of the first die 101 includes several circuitries and electrical components disposed thereon. In some embodiments, the substrate of the first die 101 is a silicon substrate. In some embodiments, the first die 101 includes a top surface **101*a*, a bottom surface 101*b* opposite to the top surface 101*a*, a sidewall 101*c*, and a first conductive pad 101*d* disposed over or within the top surface 101*a*. In some embodiments, the top surface 101*a* is a front side or active side of the first die 101. In some embodiments, the bottom surface 101*b* is a back side or inactive side of the first die 101. In some embodiments, the sidewall 101*c* is substantially orthogonal to the top surface 101*a* and the bottom surface 101*b*. In some embodiments, the sidewall 101*c* is disposed between the top surface 101*a* and the bottom surface 101*b***.

In some embodiments, the first conductive pad **101*d* is electrically connected to a circuitry external to the first die 101, such that a circuitry of the first die 101 is electrically connected to the circuitry external to the first die 101 through the first conductive pad 101*d*. In some embodiments, the first conductive pad 101*d* is configured to electrically couple with a conductive trace or a conductive structure. In some embodiments, the first conductive pad 101*d*** includes gold, silver, copper, nickel, tungsten, aluminum, palladium and/or alloys thereof.

In some embodiments, the first molding 102 surrounds or encapsulates the first die 101. In some embodiments, all surfaces of the first die 101 are interfaced with the first molding 102. In some embodiments, the top surface **101*a* and the sidewall 101*c* of the first die 101 are interfaced with or in contact to the first molding 102. In some embodiments, the first molding 102 can be a single layer film or a composite stack. In some embodiments, the first molding 102 includes various materials, such as molding compound, molding underfill, epoxy, resin, or the like. In some embodiments, the first molding 102** has a high thermal conductivity, a low moisture absorption rate and a high flexural strength.

In some embodiments, the second die 103 is disposed over the first molding 102. In some embodiments, the second die 103 is fabricated with a predetermined functional circuit within the second die 103. In some embodiments, the second die 103 comprises a variety of electrical circuits suitable for a particular application. In some embodiments, the second die 103 is configured to perform sensing function.

In some embodiments, the electrical circuits include various devices such as transistors, capacitors, resistors, diodes and/or the like. In some embodiments, the second die 103 comprises of any one of various known types of semiconductor devices such as memories (such as SRAMS, flash memories, etc.), microprocessors, application-specific integrated circuits (ASICs), or the like. In some embodiments, the second die 103 is a die, a chip or a package. In some embodiments, the second die 103 is a sensor or a sensing package. In some embodiments, the second die 103 has a top cross section (a cross section from the top view of the semiconductor structure 100 as shown in FIG. 1) in a quadrilateral, a rectangular or a square shape.

In some embodiments, the second die 103 includes a substrate which comprises semiconductive materials such as silicon. In some embodiments, the substrate of the second die 103 includes several circuitries and electrical components disposed thereon. In some embodiments, the substrate of the second die 103 is a silicon substrate. In some embodiments, second die 103 includes a first surface **103*a*, a second surface 103***b* opposite to the first surface 103*a*, a sidewall 103*c*, and a second conductive pad 103*d* disposed over or within the first surface 103*a*.

In some embodiments, the first surface 103*a* is a front side or active side of the second die 103. In some embodiments, the second surface 103*b* is a back side or inactive side of the second die 103. In some embodiments, the first surface 103*a* of the second die 103 faces the first molding 102. In some embodiments, the sidewall 103*c* is substantially orthogonal to the first surface 103*a* and the second surface 103*b*. In some embodiments, the sidewall 103*c* is disposed between the first surface 103*a* and the second surface 130*b*. In some embodiments, a sensing element in the second die 103 is configured to transmit or receive a signal from ambient environment through the second surface 103*b* or the sidewall 103*c*. In some embodiments, the sensing element is a transmitter, a receiver, a transceiver, or etc.

In some embodiments, the second conductive pad 103*d* is electrically connected to a circuitry external to the second die 103, such that a circuitry of the second die 103 is electrically connected to the circuitry external to the second die 103 through the second conductive pad 103*d*. In some embodiments, the second conductive pad 103*d* is configured to electrically couple with a conductive trace or a conductive structure. In some embodiments, the second conductive pad 103*d* includes gold, silver, copper, nickel, tungsten, aluminum, palladium and/or alloys thereof.

In some embodiments, the second molding 104 is disposed over the first molding 102 and surrounds the second die 103. In some embodiments, the second die 103 is at least partially exposed from the second molding 104. In some embodiments, a portion of the second die 103 is protruded from the second molding 104. In some embodiments, the second surface 103*b* or the sidewall 103*c* of the second die 103 is partially or entirely exposed from the second molding 104. In some embodiments, the entire second surface 103*b* of the second die 103 is exposed from the second molding 104. In some embodiments, a portion of the sidewall 103*c* of the second die 103 is interfaced with or in contact with the second molding 104, and another portion of the sidewall 103*c* of the second die 103 is exposed from the second molding 104. In some embodiments, the second surface 103*b* of the second die 103 is at a level substantially higher than a level of a top surface 104*a* of the second molding 104. In some embodiments, the second surface 103*b* or the sidewall 103*c* is partially or entirely exposed to ambient environment. In some embodiments, the second surface 103*b* or the sidewall 103*c* is not covered by or is not in contact with any component, such that the sensing element in the second die 103 can sense, transmit or receive a signal from ambient environment through the second surface 103*b* or the sidewall 103*c*.

In some embodiments, the second molding 104 includes a recess 104*b*. In some embodiments, the second die 103 is disposed within the recess 104*b* and is contacted with a sidewall of the recess 104*b*. In some embodiments, a width W1 of the recess 104*b* is substantially same as a width W2 of the second die 103. In some embodiments, the second molding 104 can be a single layer film or a composite stack. In some embodiments, the second molding 104 includes various materials, such as molding compound, molding underfill, epoxy, resin, or the like. In some embodiments, the second molding 104 has a high thermal conductivity, a low moisture absorption rate and a high flexural strength.

In some embodiments, a first dielectric layer 105 is disposed over the first molding 102. In some embodiments, the first dielectric layer 105 is disposed between the first molding 102 and the second molding 103. In some embodiments, the first dielectric layer 105 is disposed between the first molding 102 and the second die 103. In some embodiments, the first surface 103*a* of the second die 103 faces the first dielectric layer 105. In some embodiments, the first surface 103*a* of the second die 103 is interfaces with the first dielectric layer 105. In some embodiments, the first dielectric layer 105 includes dielectric material such as silicon oxide, silicon nitride, silicon carbide, silicon oxynitride or the like.

In some embodiments, a first interconnect structure 106 is surrounded by or disposed within the first dielectric layer 105. In some embodiments, the first interconnect structure 106 is extended within the first dielectric layer 105 and between the second die 103 and the first molding 102. In some embodiments, a portion of the first interconnect structure 106 is coupled with the second conductive pad 103*d*, so that the second die 103 is electrically connected to the first die 101 through the first interconnect structure 106. In some embodiments, the portion of the first interconnect structure 106 is exposed from the first dielectric layer 105. In some embodiments, the second die 103 is disposed over a portion of the first interconnect structure 106 exposed from the first dielectric layer 105. In some embodiments, the first interconnect structure 106 includes conductive material such as gold, silver, copper, nickel, tungsten, aluminum, palladium and/or alloys thereof.

In some embodiments, a second dielectric layer 107 is disposed over the first molding 102 and the first die 101. In some embodiments, the second dielectric layer 107 is interfaced with the top surface 101*a* of the first die 101. In some embodiments, the second dielectric layer 107 includes dielectric material such as silicon oxide, silicon nitride, silicon carbide, silicon oxynitride or the like.

In some embodiments, a second interconnect structure 108 is surrounded by or disposed within the second dielectric layer 107. In some embodiments, the second interconnect structure 108 is extended within the second dielectric layer 107. In some embodiments, a portion of the second interconnect structure 108 is coupled with the first conductive pad 101*d* to electrically connect to the first die 101. In some embodiments, the portion of the second interconnect structure 108 is exposed from the second dielectric layer 107. In some embodiments, the second interconnect structure 108 includes conductive material such as gold, silver, copper, nickel, tungsten, aluminum, palladium and/or alloys thereof.

In some embodiments, a connector 109 is disposed below the second dielectric layer 107. In some embodiments, the connector 109 is electrically coupled with the second interconnect structure 108. In some embodiments, the connector 109 is disposed below or coupled with a portion of the second interconnect structure 108 exposed from the second dielectric layer 107. In some embodiments, a bump pad is disposed over the portion of the second interconnect structure 108, and the connector 109 is disposed over the bump pad. In some embodiments, the connector 109 is configured to electrically connect to a circuitry or a conductive structure. In some embodiments, the connector 109 includes conductive material such as includes solder, copper, nickel, gold or etc. In some embodiments, the connector 109 is a conductive bump, a solder ball, a ball grid array (BGA) ball, controlled collapse chip connection (C4) bump, microbump, a pillar, a post or the like. In some embodiments, the connector 109 is in a spherical, hemispherical or cylindrical shape.

In some embodiments, a conductive via 110 is surrounded by the first molding 102. In some embodiments, the conductive via 110 is extended through the first molding 102. In some embodiments, the conductive via 110 is a through integrated fan out via (TIV) extending through the first molding 102. In some embodiments, the conductive via 110 is electrically connected to the first interconnect structure 106 or the second interconnect structure 108. In some embodiments, the first die 101 is electrically connected to the second die 103 through the conductive via 110. In some embodiments, the conductive via 110 includes conductive material such as gold, silver, copper, nickel, tungsten, aluminum, tin and/or alloys thereof.

Figure 2:
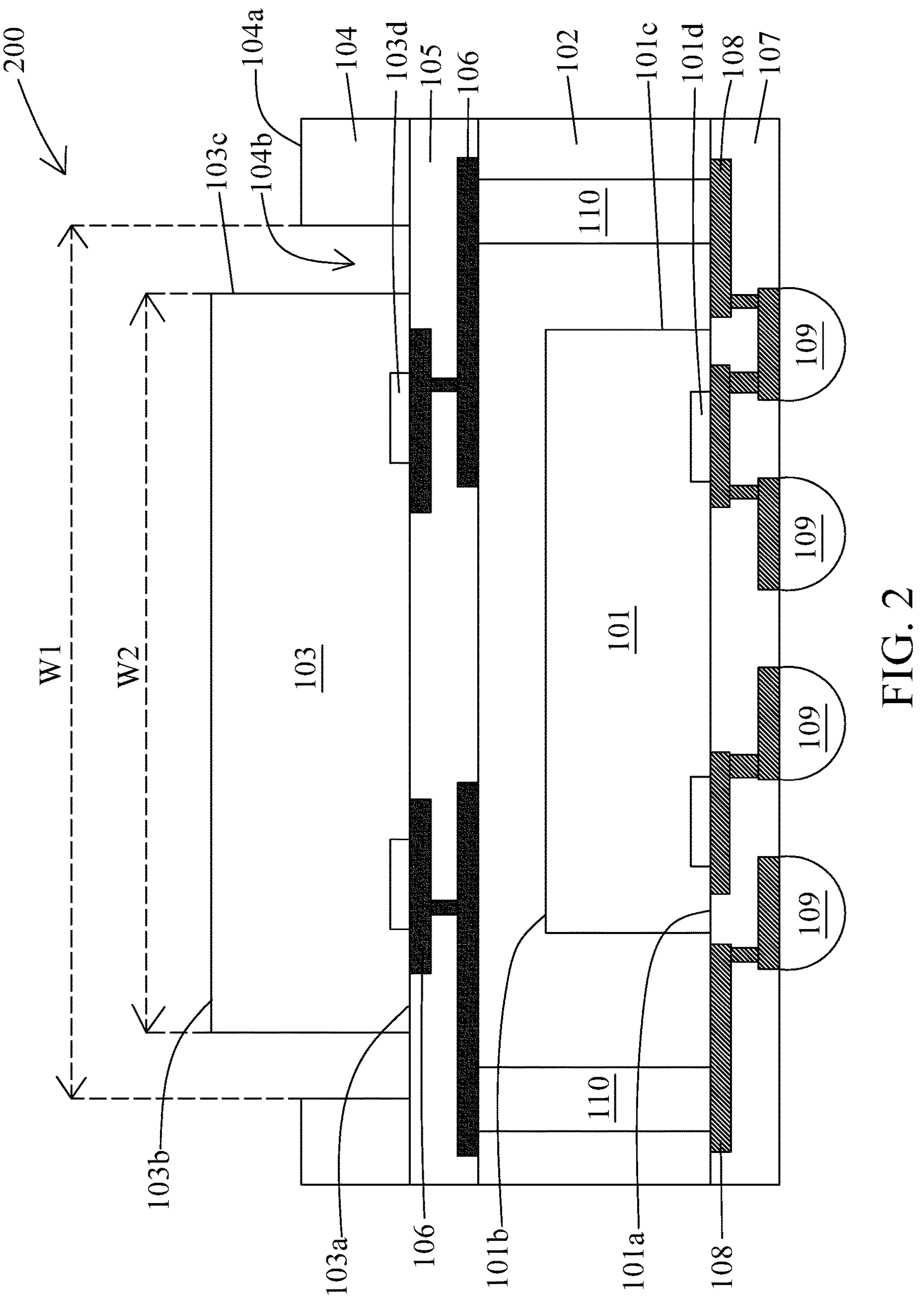
FIG. 2 is a schematic cross sectional view of a semiconductor structure in accordance with some embodiments of the present disclosure.

FIG. 2 is a schematic cross sectional view of a semiconductor structure 200 in accordance with various embodiments of the present disclosure. In some embodiments, the semiconductor structure 200 includes a first die 101, a first molding 102, a second die 103 and a second molding 104, which have similar configurations as described above or illustrated in FIG. 1.

In some embodiments, the second molding 104 includes a recess 104*b* extending through the second molding 104. In some embodiments, the second die 103 is disposed within the recess 104*b*. In some embodiments, there is a gap between the second die 103 and the second molding 104. In some embodiments, the second surface 103*b* and the sidewall 103*c* of the second die 103 are apart from the second molding 104. In some embodiments, the second surface 103*b* and the sidewall 103*c* of the second die 103 are entirely exposed from the second molding 104 and do not contact with the second molding 104.

In some embodiments, a width W1 of the recess 104*b* is substantially greater than a width W2 of the second die 103. In some embodiments, a first dielectric layer 105 is disposed between the first molding 102 and the second die 103, and a first interconnect structure 106 is disposed within the first dielectric layer 105, and the recess 104*b* is disposed over a portion of the first interconnect structure 106 exposed from the first dielectric layer 105. In some embodiments, such partial or entire exposure of the second die 103 allows the second die 103 performing sensing functions.

Figure 3:
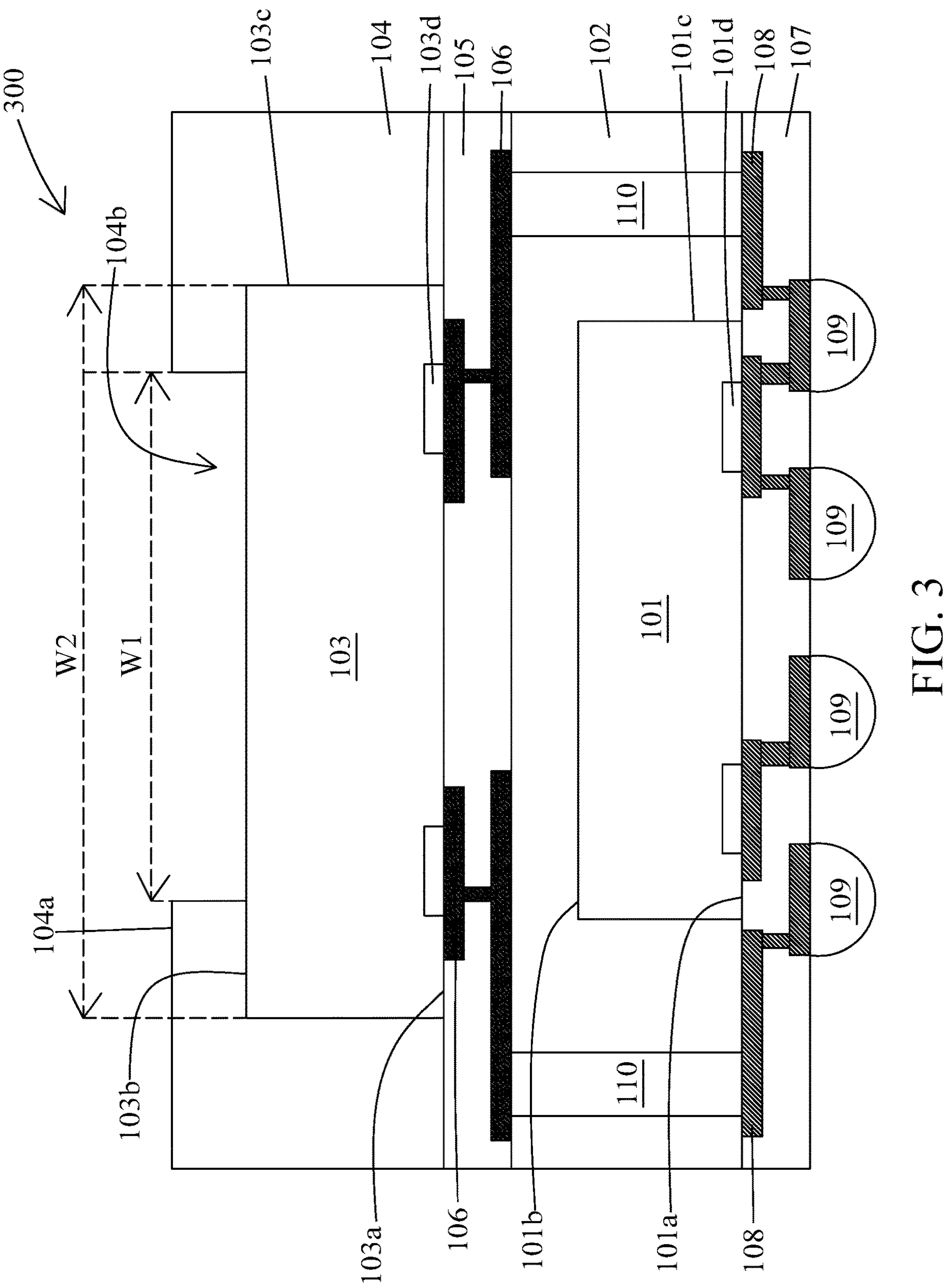
FIG. 3 is a schematic cross sectional view of a semiconductor structure in accordance with some embodiments of the present disclosure.

FIG. 3 is a schematic cross sectional view of a semiconductor structure 300 in accordance with various embodiments of the present disclosure. In some embodiments, the semiconductor structure 300 includes a first die 101, a first molding 102, a second die 103 and a second molding 104, which have similar configurations as described above or illustrated in FIG. 1 or 2.

In some embodiments, the second molding 104 includes a recess 104*b* disposed over the second die 103. In some embodiments, the second die 103 is partially covered by the second molding 104. In some embodiments, the recess 104*a* is disposed over the second surface 103*b* of the second die 103. In some embodiments, a level of a top surface 104*a* of the second molding 104 is substantially higher than a level of the second surface 103*b* of the second die 103. In some embodiments, a portion of the second surface 103*b* of the second die 103 is exposed from the second molding 104. In some embodiments, the sidewall 103*c* of the second die 103 is entirely interfaced with or in contact to the second molding 104. In some embodiments, a width W1 of the recess 104*b* is substantially less than a width W2 of the second die 103.

Figure 4:
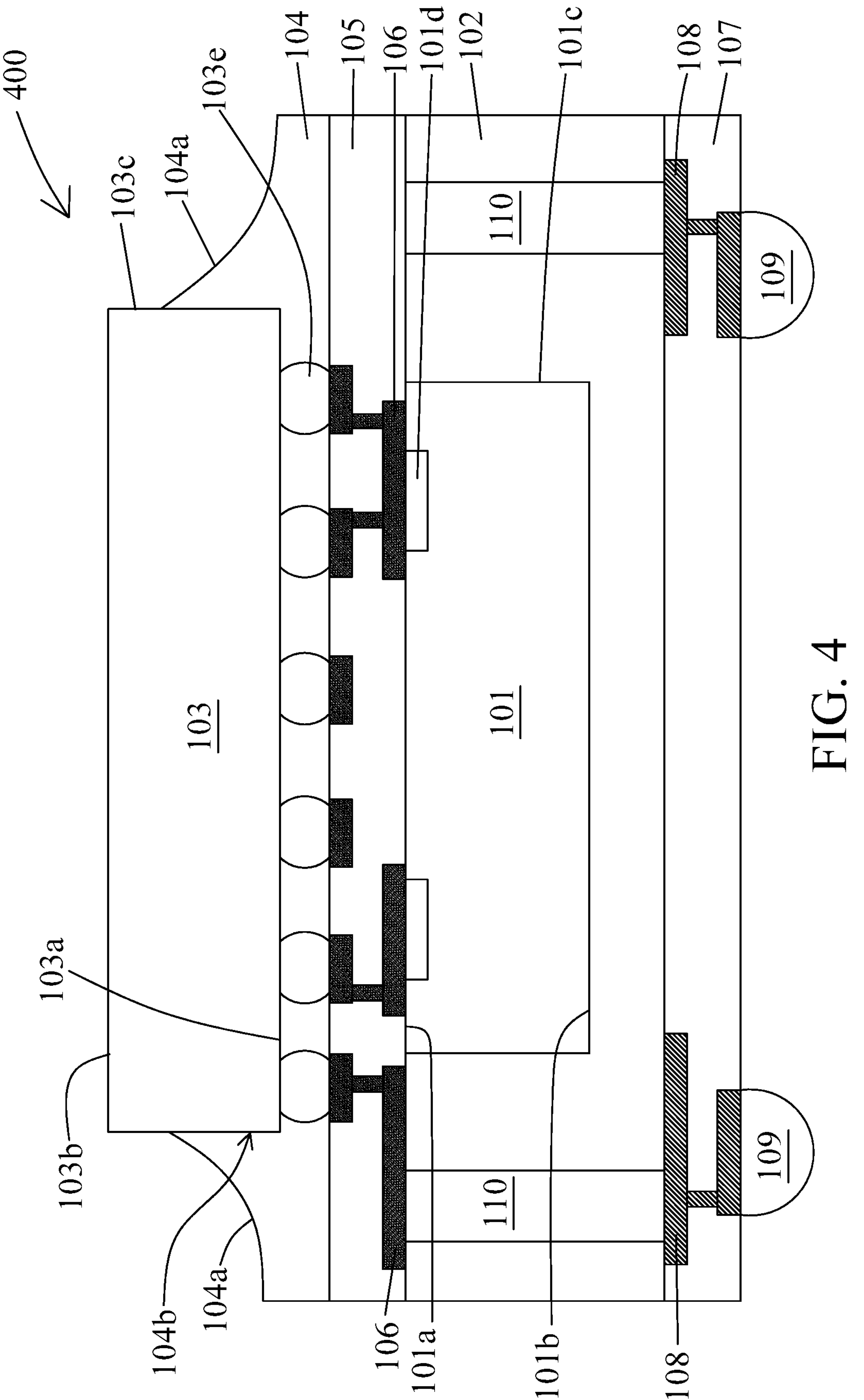
FIG. 4 is a schematic cross sectional view of a semiconductor structure in accordance with some embodiments of the present disclosure.
Figure 5:
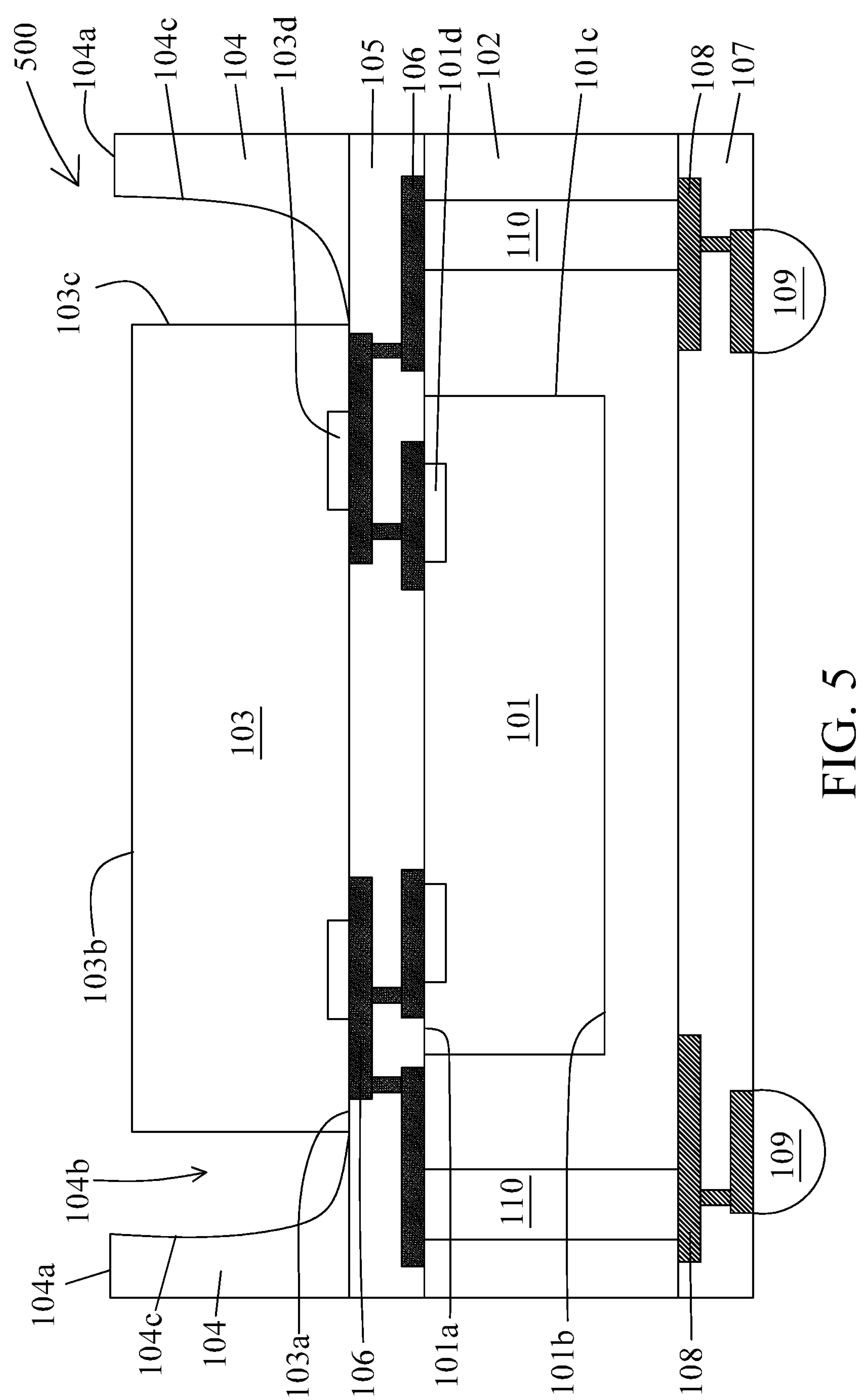
FIG. 5 is a schematic cross sectional view of a semiconductor structure in accordance with some embodiments of the present disclosure.
Figure 6:
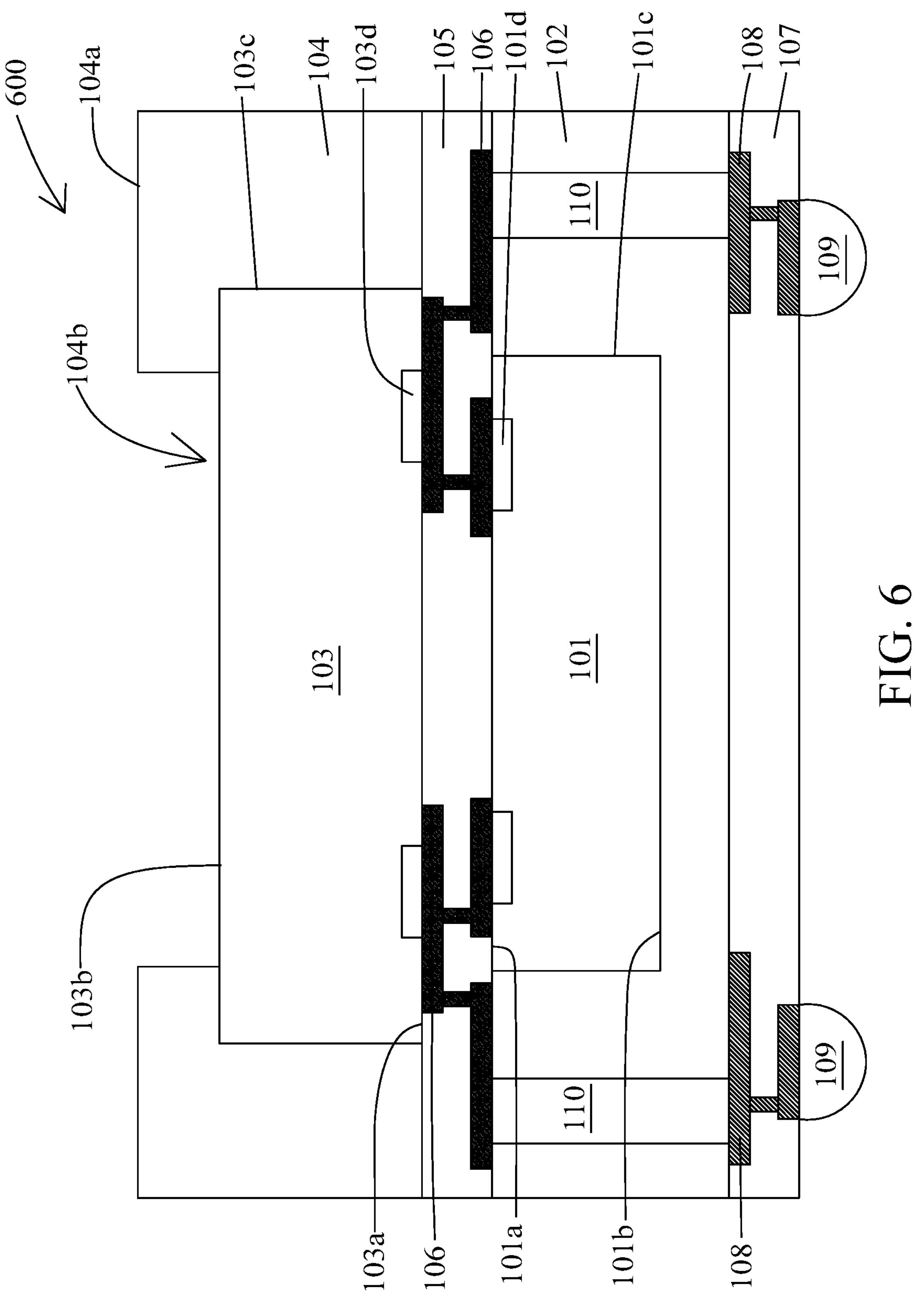
FIG. 6 is a schematic cross sectional view of a semiconductor structure in accordance with some embodiments of the present disclosure.

FIGS. 4-6 are schematic cross sectional views of semiconductor structures (400, 500 or 600) respectively in accordance with various embodiments of the present disclosure. In some embodiments, the semiconductor structures (400, 500 or 600) respectively include a first die 101, a first molding 102, a second die 103 and a second molding 104, which have similar configurations as described above or illustrated in FIGS. 1-3 respectively.

In some embodiments, the first die 101 is flipped, that a top surface 101*a* of the first die 101 faces the second die 103 while a bottom surface 101*b* of the first die 101 is disposed distal to the second die 103. In some embodiments, the bottom surface 101*b* and a sidewall 101*c* of the first die 101 are interfaced with the first molding 102, and the top surface 101*a* of the first die 101 is exposed from the first molding 102. In some embodiments, the top surface 101*a* of the first die 101 is interfaced with a first dielectric layer 105 disposed between the first die 101 and the second die 103. In some embodiments, the first conductive pad 101*d* of the first die 101 is electrically connected to a first interconnect structure 106 disposed within the first dielectric layer 105.

In some embodiments as shown in FIG. 4, the top surface 104*a* of the second molding 104 is a curved surface. In some embodiments, the top surface 104*a* is in convex configuration. In some embodiments, the second die 103 includes a conductive bump 103*e* disposed under the first surface 103*a* of the second die 103. In some embodiments, the conductive bump 103*e* is electrically connected to the first interconnect structure 106, such that the first die 101 is electrically connected to the second die 103 through the conductive bump 103*e* and the first interconnect structure 106. In some embodiments, some of the second molding 104 surround the conductive bump 103*e* and are disposed between the second die 103 and the first dielectric layer 105.

In some embodiments as shown in FIG. 5, the second die 103 is disposed within the recess 104*b* of the second molding 104. In some embodiments, a sidewall 104*c* of the recess 104*b* is a curved surface. In some embodiments, the sidewall 104*c* is curved away from the second die 103. In some embodiments, the sidewall 104*c* is in a convex configuration.

FIGS. 7-10 are schematic cross sectional views of semiconductor structures (700, 800, 900 and 1000) respectively in accordance with various embodiments of the present disclosure. In some embodiments, the semiconductor structures (700, 800, 900 and 1000) respectively include a first die 101, a first molding 102, a second die 103 and a second molding 104, which have similar configurations as described above or illustrated in FIGS. 1-3 respectively.

Figure 7:
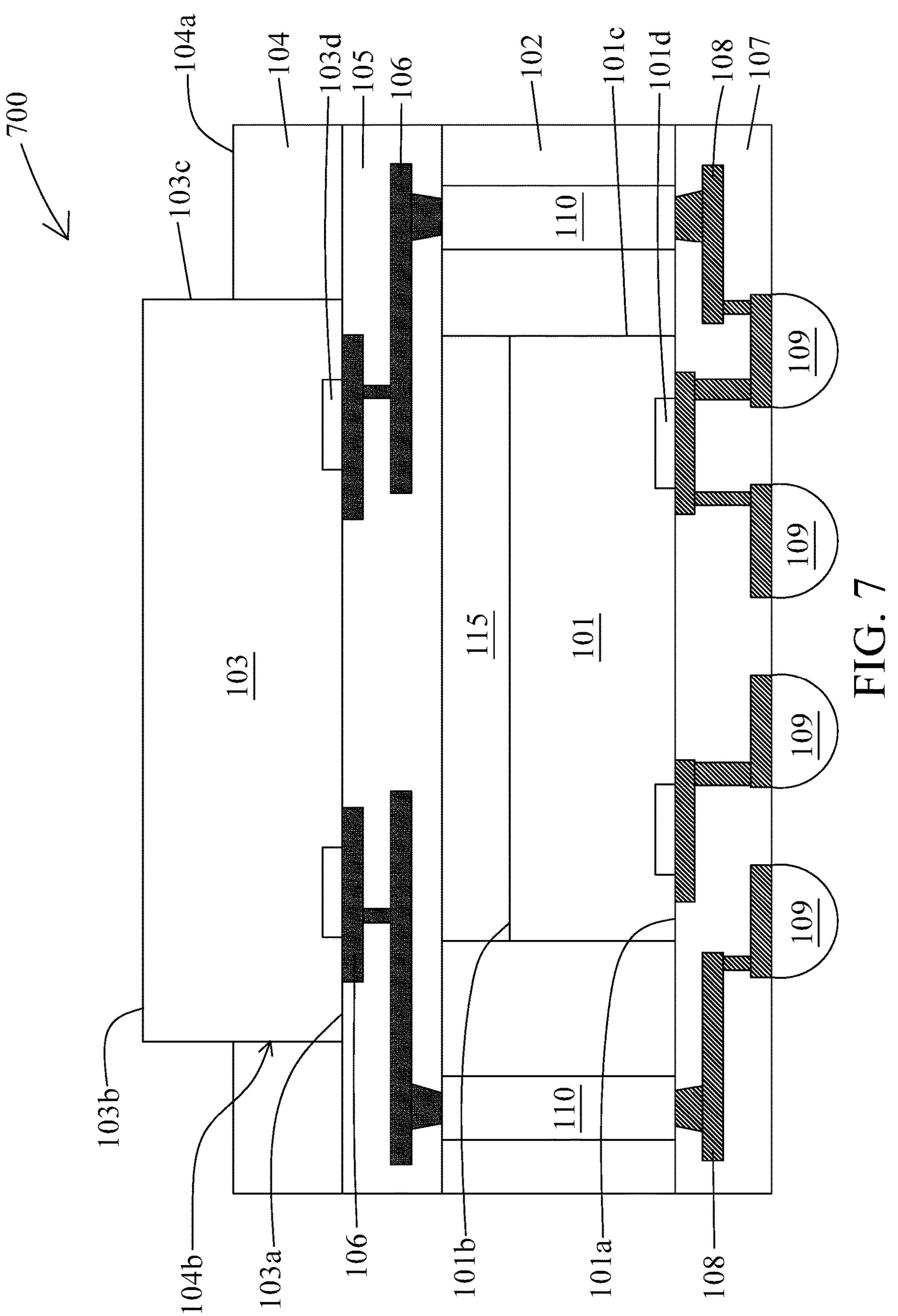
FIG. 7 is a schematic cross sectional view of a semiconductor structure in accordance with some embodiments of the present disclosure.
Figure 8:
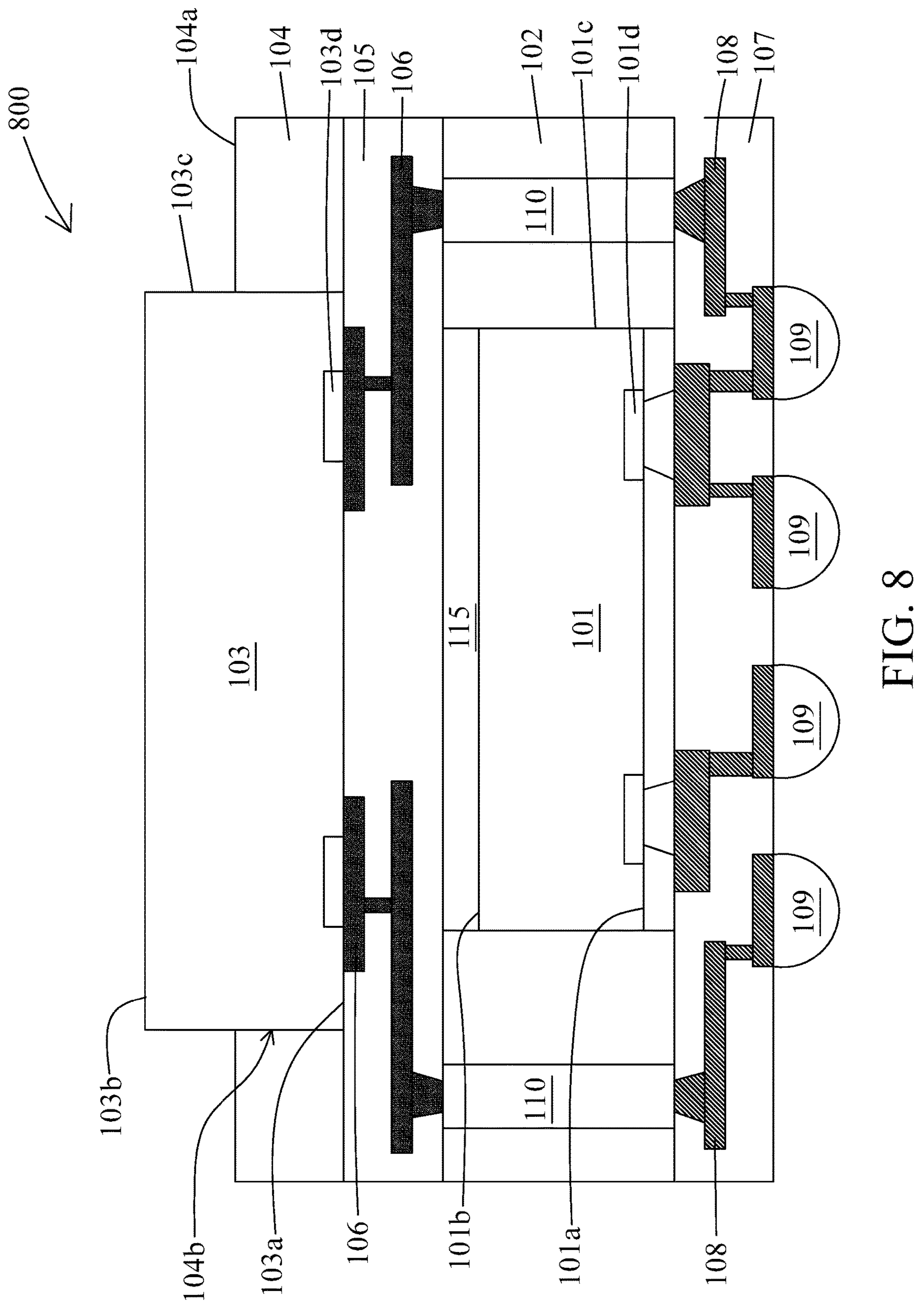
FIG. 8 is a schematic cross sectional view of a semiconductor structure in accordance with some embodiments of the present disclosure.

In some embodiments as shown in FIGS. 7 and 8, the semiconductor structures (700 and 800) respectively include an adhesive 115 disposed between the first dielectric layer 105 and the first die 101. In some embodiments, the adhesive 115 includes glue, a die attach film (DAF), etc. In some embodiments, the adhesive 115 is surrounded by the first molding 102. In some embodiments, the adhesive 115 is disposed over the bottom surface 101*b* of the first die 101.

Figure 9:
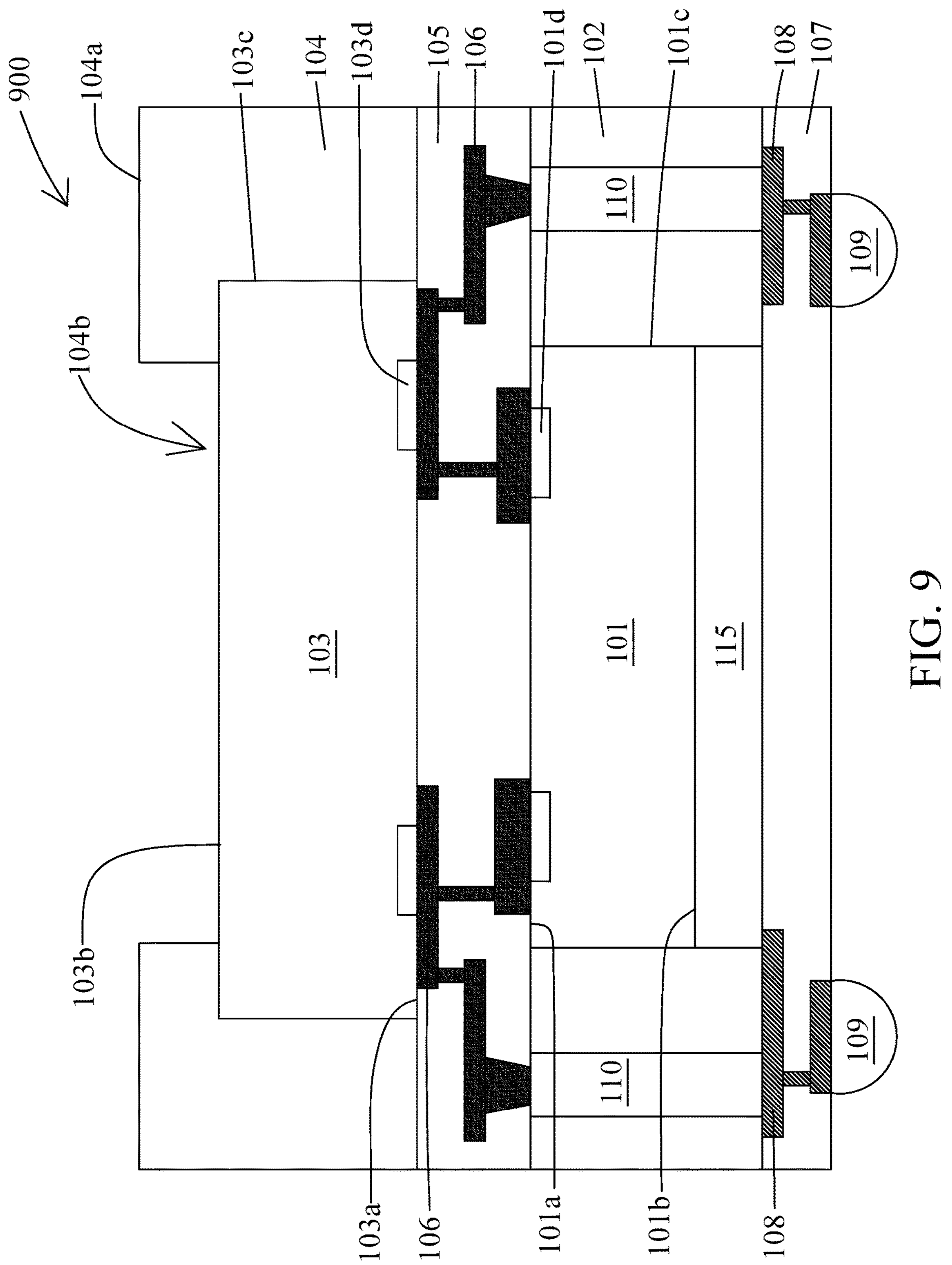
FIG. 9 is a schematic cross sectional view of a semiconductor structure in accordance with some embodiments of the present disclosure.
Figure 10:
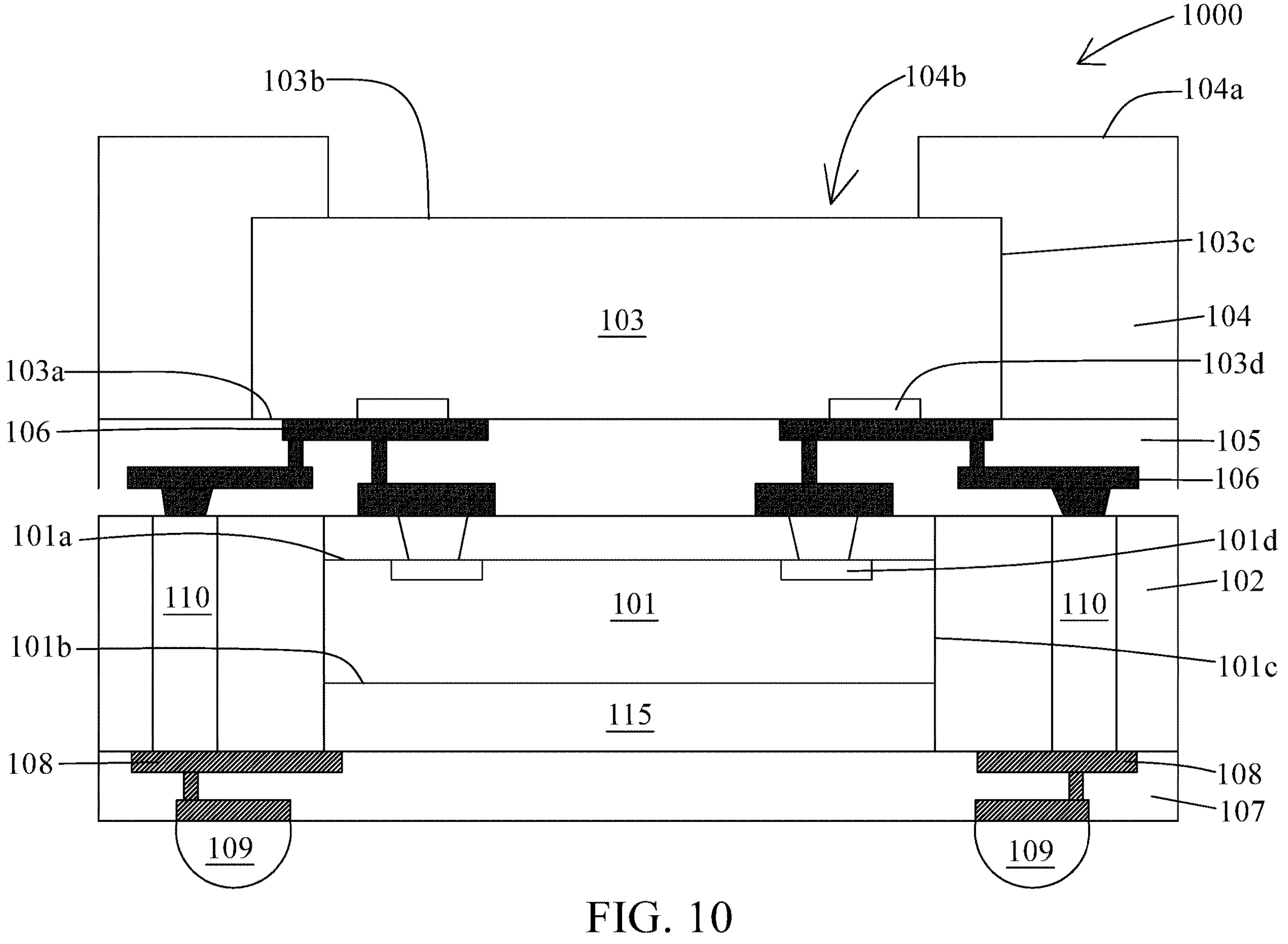
FIG. 10 is a schematic cross sectional view of a semiconductor structure in accordance with some embodiments of the present disclosure.

In some embodiments as shown in FIGS. 9 and 10, the semiconductor structures (900 and 1000) respectively include the adhesive 115 disposed between the second dielectric layer 107 and the first die 101. In some embodiments, the adhesive 115 is surrounded by the first molding 102. In some embodiments, the adhesive 115 is disposed over the bottom surface 101*b* of the first die 101.

Figure 11:
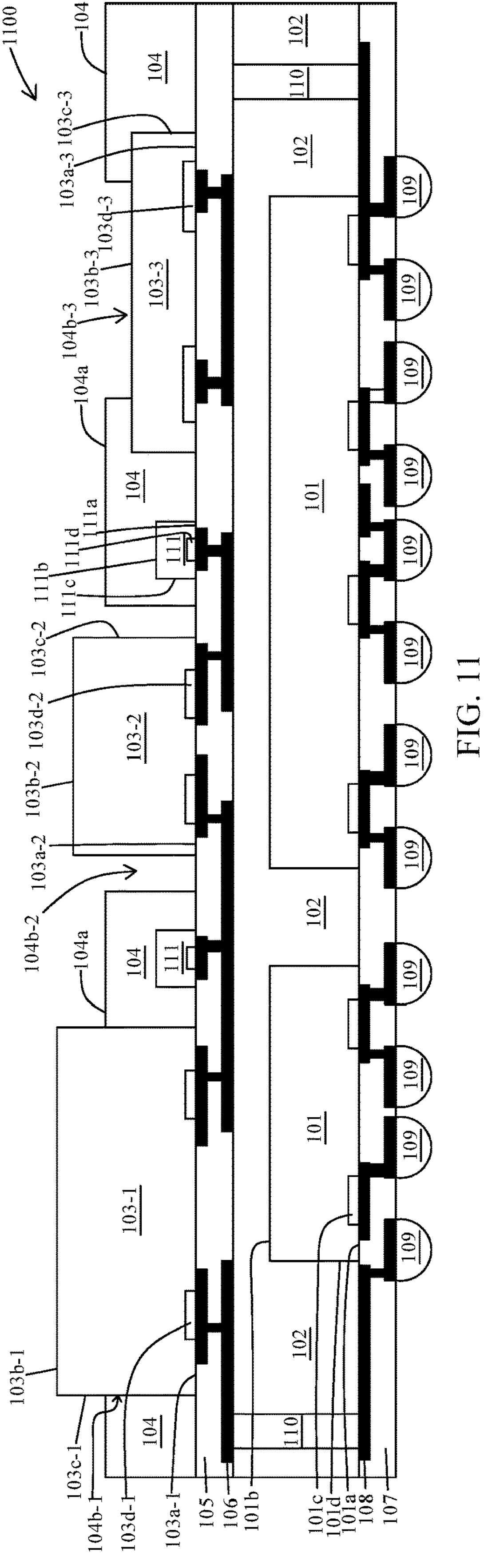
FIG. 11 is a schematic cross sectional view of a semiconductor structure in accordance with some embodiments of the present disclosure.

FIG. 11 is a schematic cross sectional view of a semiconductor structure 1100 in accordance with various embodiments of the present disclosure. In some embodiments, the semiconductor structure 1100 is combination of the semiconductor structures (100, 200 or 300). In some embodiments, the semiconductor structure 1100 includes a first die 101 and a first molding 102, which have similar configurations as described above or illustrated in any one of FIGS. 1-10. In some embodiments, the semiconductor structure 1100 includes second dies (103-1, 103-2, 103-3) which are in similar configuration as the second die 103 illustrated in FIGS. 1-3 respectively. In some embodiments, the semiconductor structure 700 includes a second molding 104 which is in similar configuration as the second molding 104 illustrated in FIGS. 1-3 respectively. In some embodiments, the second molding 104 includes recesses (104*b*-1, 104*b*-2, 104*b*-3) which are in similar configuration as the recess 104*b* illustrated in FIGS. 1-3 respectively.

In some embodiments, the semiconductor structure 1100 includes a third die 111 encapsulated by the second molding 104. In some embodiments, the third die 111 is a die, a chip or a package. In some embodiments, the third die 111 is disposed adjacent to the second die (103-1, 103-2 or 103-3). In some embodiments, the third die 111 is disposed between two of the second dies (103-1, 103-2 or 103-3). In some embodiments, a thickness of the third die 111 is substantially less than a thickness of the second die (103-1, 103-2 or 103-3). In some embodiments, the third die 111 includes a top surface 111*a*, a bottom surface 111*b* opposite to the top surface 111*a*, a sidewall 111*c* between the top surface 111*a* and the bottom surface 111*b*, and a third conductive pad 111*d* disposed over the top surface 111*a*. In some embodiments, a top surface 104*a* of the second molding 104 is at a level substantially higher than a level of the bottom surface 111*b* of the third die 111. In some embodiments, the bottom surface 111*b* and the sidewall 111*c* of the third die 111 are contacted with the second molding 104.

Figure 12:
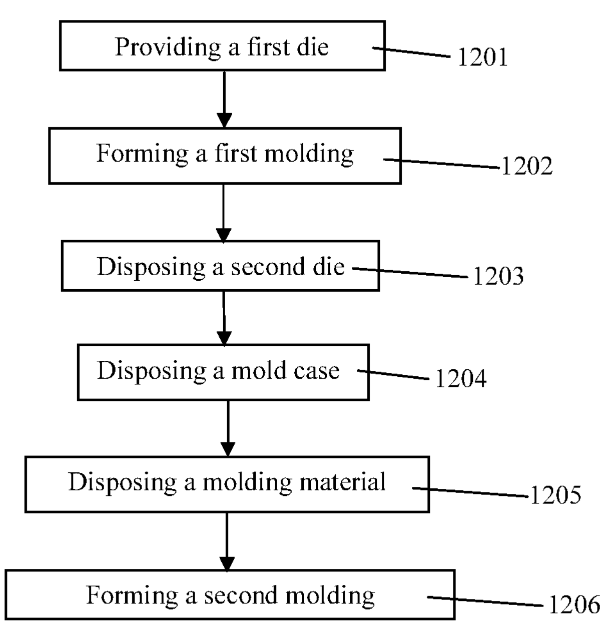
FIG. 12 is a flow diagram of a method of manufacturing a semiconductor structure in accordance with some embodiments of the present disclosure.

In the present disclosure, a method of manufacturing a semiconductor structure (100, 200, 300, 400, 500, 600, 700, 800, 900, 1000 or 1100) is also disclosed. In some embodiments, a semiconductor structure (100, 200, 300, 400, 500, 600, 700, 800, 900, 1000 or 1100) is formed by a method 1200. The method 1200 includes a number of operations and the description and illustration are not deemed as a limitation as the sequence of the operations. FIG. 12 is an embodiment of the method 1200 of manufacturing the semiconductor structure (100, 200, 300, 400, 500, 600, 700, 800, 900, 1000 or 1100). The method 1200 includes a number of operations (1201, 1202, 1203, 1204, 1205 and 1206).

Figures 12A, 12B, 12C:
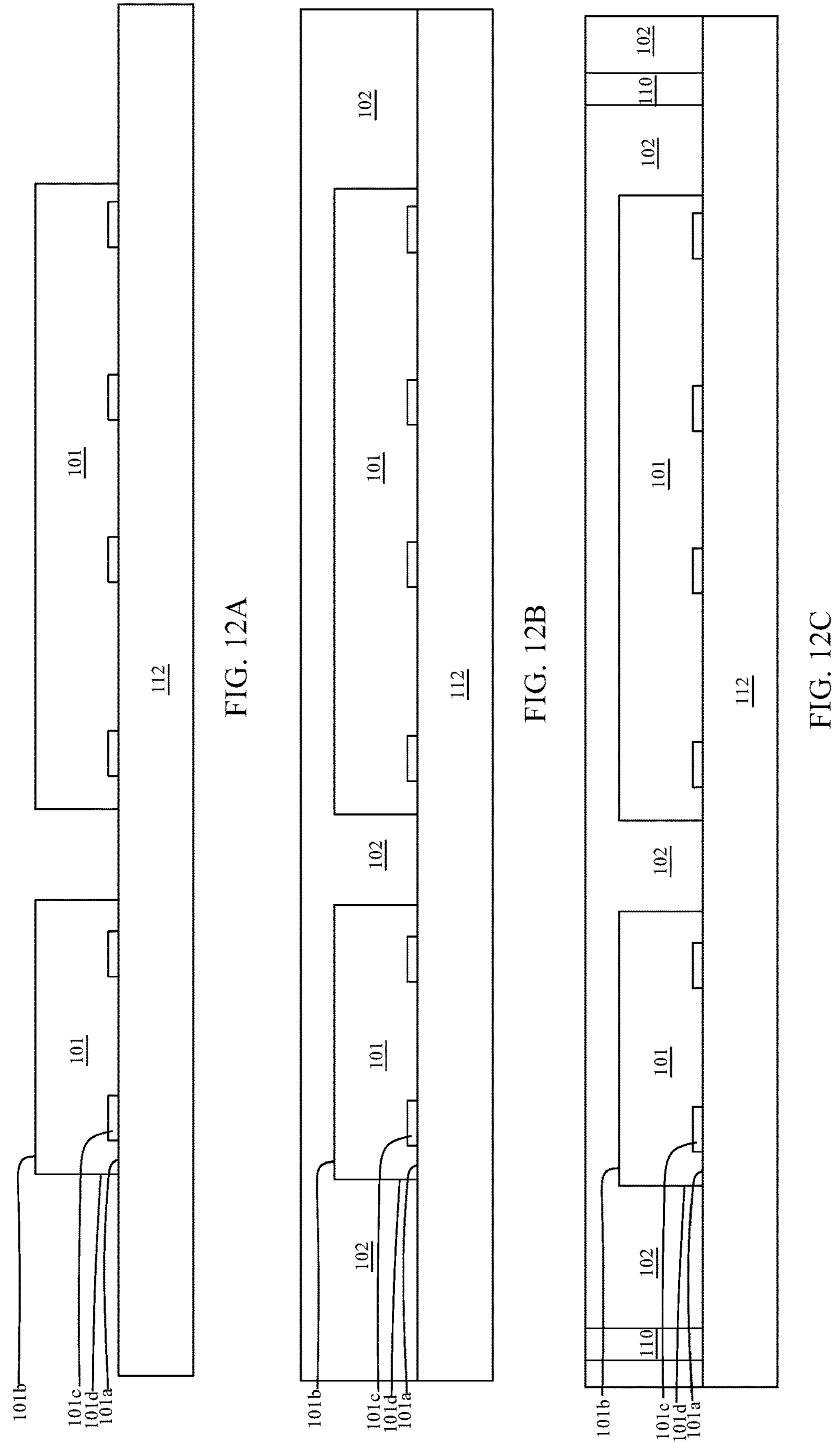
FIGS. 12A-12J are schematic views of manufacturing a semiconductor structure by a method of FIG. 12 in accordance with some embodiments of the present disclosure.

In operation 1201, a first die 101 is provided or received as shown in FIG. 12A. In some embodiments, the first die 101 is a die, a chip or a package. In some embodiments, the first die 101 comprises a variety of electrical circuits suitable for a particular application. In some embodiments, the first die 101 has similar configuration as described above or illustrated in any one of FIGS. 1-11. In some embodiments, a carrier 112 is provided for temporarily supporting the first die 101 and other components subsequently disposed thereon. In some embodiments, the carrier 112 is a substrate or a wafer. In some embodiments, the carrier 112 includes silicon, glass, ceramic or the like. In some embodiments, a top surface 101*a* of the first die 101 is disposed over the carrier 112.

In operation 1202, a first molding 102 is formed as shown in FIG. 12B. In some embodiments, the first molding 102 encapsulates the first die 101. In some embodiments, the bottom surface 101*b* and the sidewall 101*c* of the first die 101 are contacted with the first molding 102. In some embodiments, the first molding 102 is formed by transfer molding, injection molding or any other suitable operations. In some embodiments, the first molding 102 has similar configuration as described above or illustrated in any one of FIGS. 1-11.

In some embodiments as shown in FIG. 12C, a conductive via 110 is surrounded by the first molding 102. In some embodiments, the conductive via 110 extends through the first molding 102. In some embodiments, the conductive via 110 is formed by removing a portion of the first molding 102 to form an opening and disposing a conductive material into the opening. In some embodiments, the conductive material is disposed by electroplating, electroless plating or other suitable operations. In some embodiments, the opening is formed by photolithography and etching operations. In some embodiments, a portion of the conductive via 110 is exposed from the first molding 102. In some embodiments, the conductive via 110 has similar configuration as described above or illustrated in any one of FIGS. 1-11.

Figures 12D, 12E:
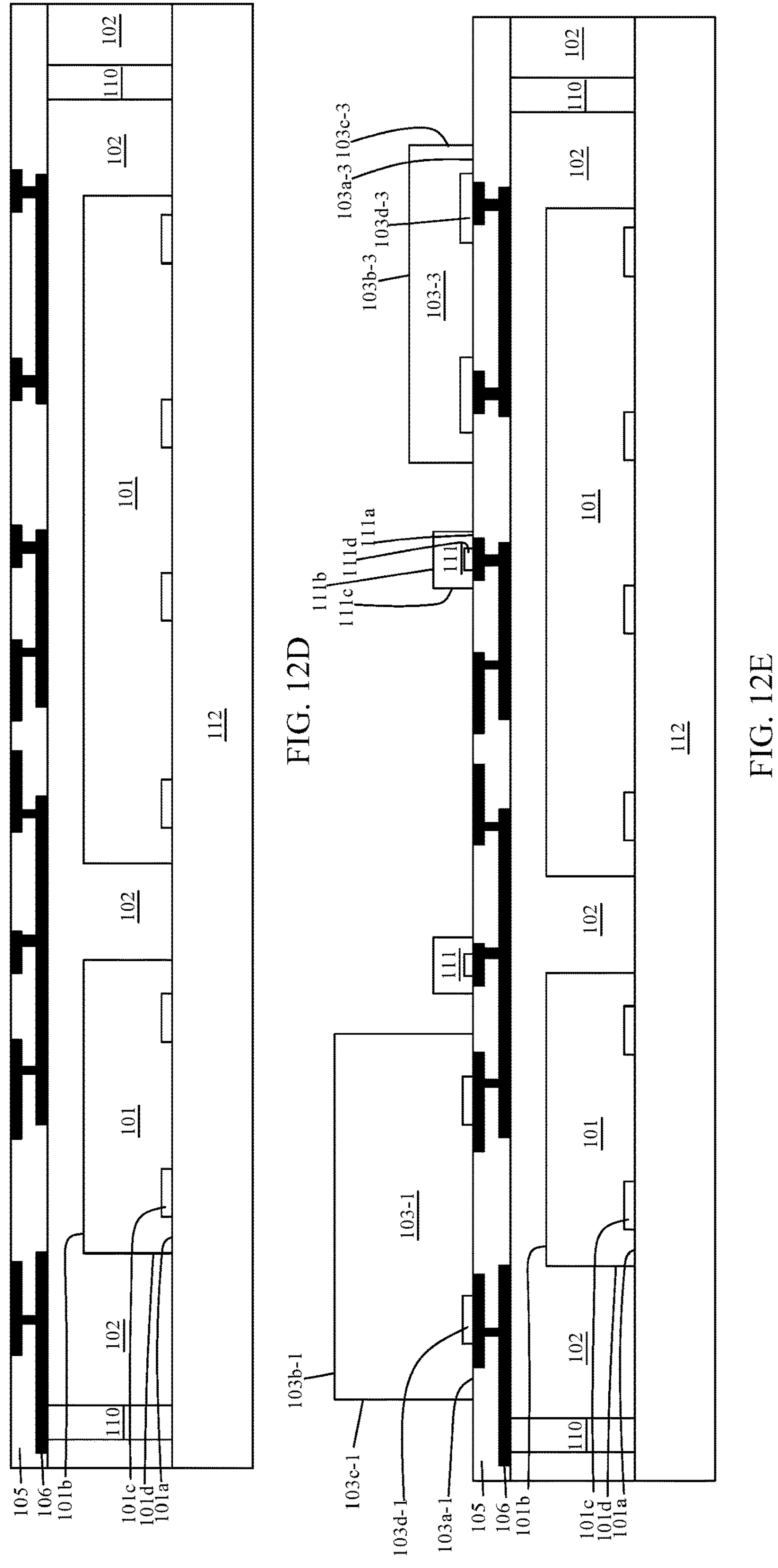

In some embodiments as shown in FIG. 12D, a first dielectric layer 105 and a first interconnect structure 106 are formed over the first molding 102. In some embodiments, the first dielectric layer 105 is disposed over the first molding 102 by spin coating, chemical vapor deposition (CVD) or any other suitable operations. In some embodiments, the first interconnect structure 106 is disposed within the first dielectric layer 105. In some embodiments, the first dielectric layer 105 is patterned by photolithography and etching operations. In some embodiments, the first interconnect structure 106 is formed by removing a portion of the first dielectric layer 105 and then disposing a conductive material. In some embodiments, the conductive material is disposed by electroplating, electroless plating or other suitable operations. In some embodiments, the first interconnect structure 106 is electrically connected to the conductive via 110. In some embodiments, a portion of the first interconnect structure 106 is exposed from the first dielectric layer 105. In some embodiments, the first dielectric layer 105 and the first interconnect structure 106 have similar configurations as described above or illustrated in any one of FIGS. 1-11.

In operation 1203, a second die (103-1, 103-3) is disposed over the first molding 102 as shown in FIG. 12E. In some embodiments, the second die (103-1, 103-3) is mounted over the first molding 102. In some embodiments, the second die (103-1, 103-3) is disposed over the portion of the first interconnect structure 106 exposed from the first dielectric layer 105 to electrically connect with the first interconnect structure 106 or the first die 101. In some embodiments, a first surface (103*a*-1, 103*a*-3) of the second die (103-1, 103-3) is disposed over the first dielectric layer 105. In some embodiments, a second conductive pad (103*d*-1, 103*d*-3) of the second die (103-1, 103-3) is disposed over and electrically connected to the first interconnect structure 106. In some embodiments, the second die (103-1, 103-3) has similar configuration as described above or illustrated in any one of FIGS. 1-11.

In some embodiments, a third die 111 is disposed over the first molding 102 as shown in FIG. 12E. In some embodiments, the third die 111 is mounted over the first molding 102. In some embodiments, the third die 111 is disposed over the portion of the first interconnect structure 106 exposed from the first dielectric layer 105 to electrically connect with the first interconnect structure 106 or the first die 101. In some embodiments, a third conductive pad 111*d* of the third die 111 is disposed over and electrically connected to the first interconnect structure 106. In some embodiments, the third die 111 has similar configuration as described above or illustrated in FIG. 11.

Figure 12F:
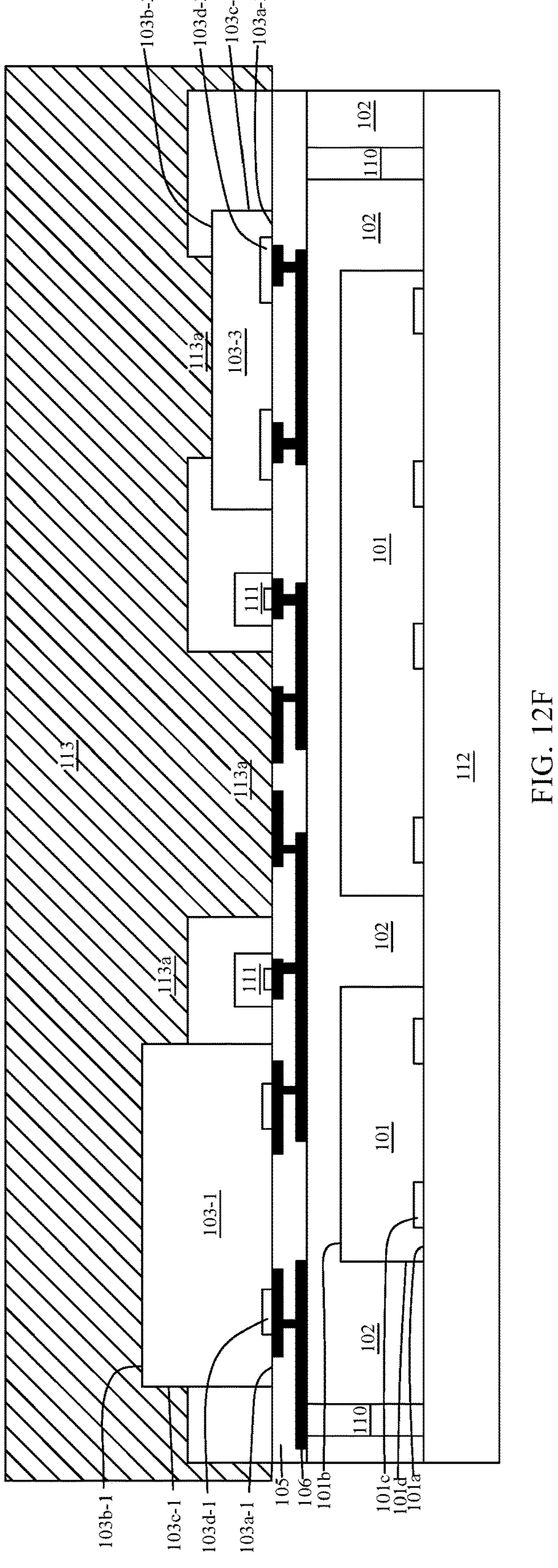

In operation 1204, a mold chase 113 is disposed over the second die (103-1, 103-3), the first molding 102 and the third die 111 as shown in FIG. 12F. In some embodiments, the mold chase 113 is configured for forming a molding. In some embodiments, the mold chase 113 is in a predetermined shape or configuration. In some embodiments, the mold chase 113 includes a protrusion 113*a* protruded from the mold chase towards the first molding 102. In some embodiments, the protrusion 113*a* is disposed over the second die 103-3 or adjacent to the second die 103-1. In some embodiments, the protrusion 113*a* is disposed over or is contacted with the first dielectric layer 105 or the first interconnect structure 106. In some embodiments, the mold chase 113 includes steel or the like. In some embodiments, a release film is disposed over a surface of the mold chase 113 facing to the first molding 102 and the second die (103-1, 103-3).

Figure 12G:
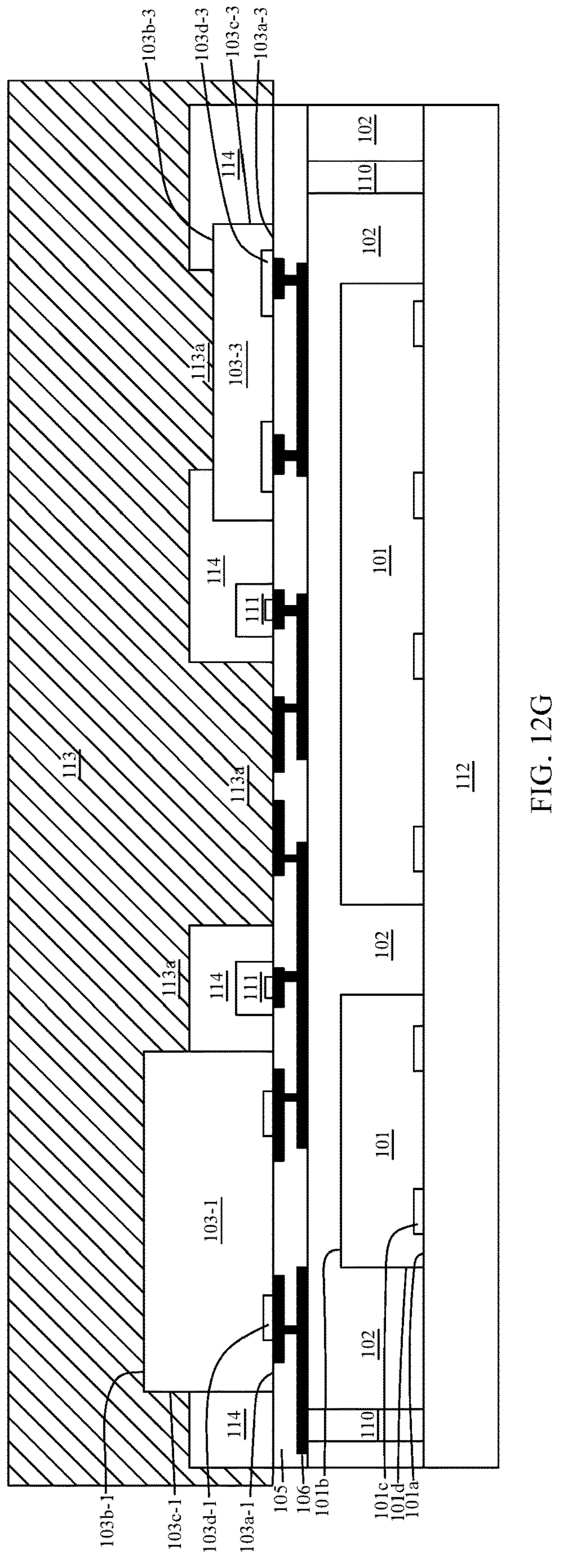

In operation 1205, a molding material 114 is disposed between the mold chase 113 and the first molding 102 as shown in FIG. 12G. In some embodiments, a space defined by the mold chase 113, the second die (103-1, 103-3) and the first dielectric layer 105 is filled by the molding material 114. In some embodiments, the molding material 114 surrounds the protrusion 113*a*. In some embodiments, the molding material 114 includes molding compound, molding underfill, epoxy, resin, or the like.

Figure 12H:
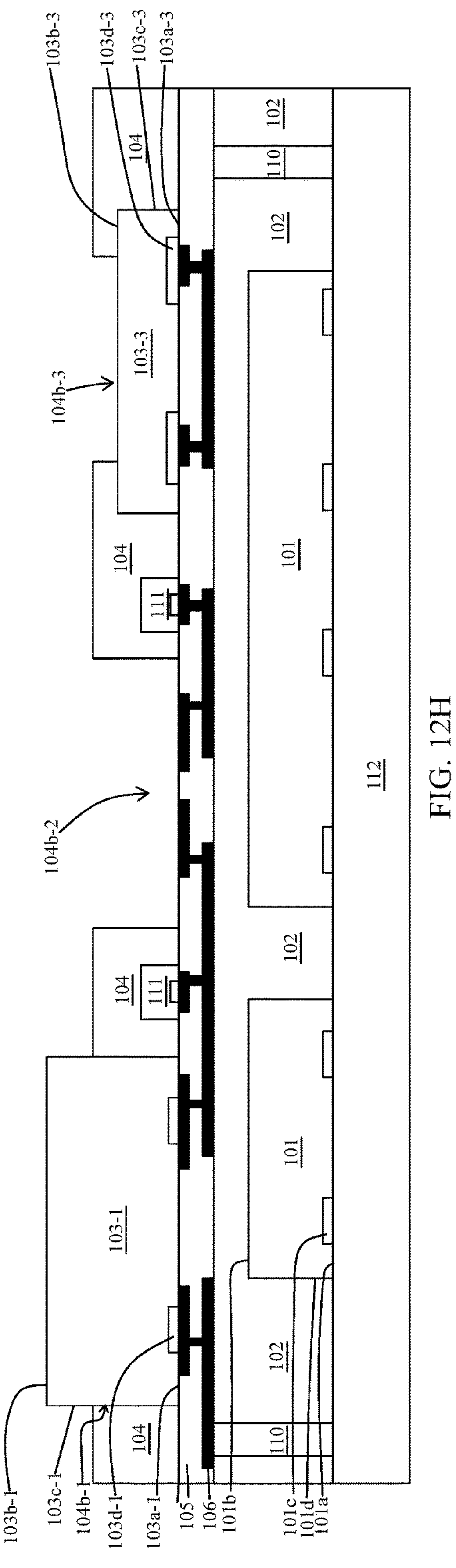

In operation 1206, a second molding 104 is formed as shown in FIG. 12H. In some embodiments, the second molding 104 is formed after curing the molding material 114. In some embodiments, the mold chase 113 is removed after the formation of the second molding 104. In some embodiments, the second die (103-1, 103-3) is surrounded by the second molding 104. In some embodiments, the third die 111 is encapsulated by the second molding 104. In some embodiments, the second die (103-1, 103-3) is at least partially exposed from the second molding 104. In some embodiments, the second molding 104 is formed by transfer molding, compression molding, print molding or any other suitable operations.

In some embodiments, the second molding 104 includes a recess (104*b*-1, 104*b*-2, 104*b*-3). In some embodiments, a sidewall of the recess (104*b*-1, 104*b*-2, 104*b*-3) is conformal to an outer surface of the protrusion 113*a* of the mold chase 113. In some embodiments, the recess 104*b*-1 surrounds the second die 103-1. In some embodiments, the recess 104*b*-2 extends through the second molding 104. In some embodiments, the recess 104*b*-3 is disposed over the second die 103-3.

In some embodiments, the second molding 104 is formed by disposing the molding material 114 over the second die (103-1, 103-3), the third die 111 and the first dielectric layer 105, and inserting the protrusion 113*a* of the mold chase 113 into the molding material 114. In some embodiments, the recess (104*b*-1, 104*b*-2, 104*b*-3) is formed and the sidewall of the recess (104*b*-1, 104*b*-2, 104*b*-3) is conformal to the outer surface of the protrusion 113*a* of the mold chase 113 after the insertion of the protrusion 113*a*.

Figure 12I:
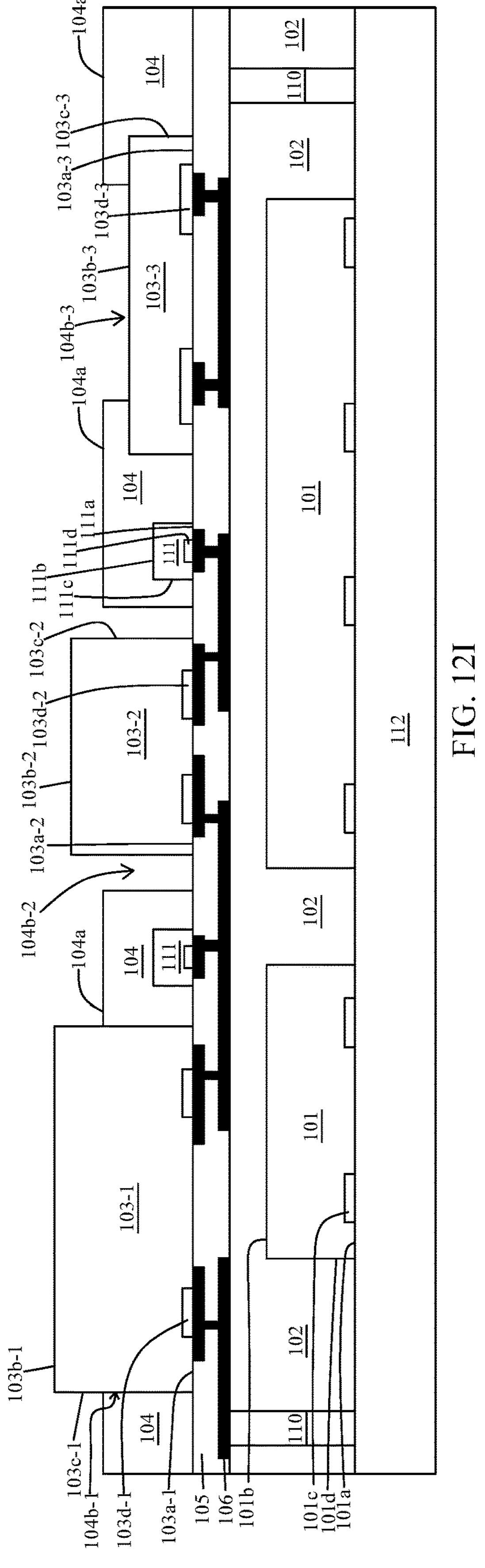

In some embodiments as shown in FIG. 12I, another second die 103-2 is disposed within the recess 104*b*-2. In some embodiments, there is a gap between the second die 103-2 and the second molding 104. In some embodiments, the second surface 103*b*-2 and the sidewall 103*c*-2 of the second die 103-2 are apart from the second molding 104. In some embodiments, the second surface 103*b*-2 and the sidewall 103*c*-2 of the second die 103-2 are entirely exposed from the second molding 104 and do not contact with the second molding 104. In some embodiments, the second die 103-2 is electrically connected to the first die 101 through the first interconnect structure 106. In some embodiments, the second molding 104 has similar configuration as described above or illustrated in any one of FIGS. 1-11.

Figure 12J:
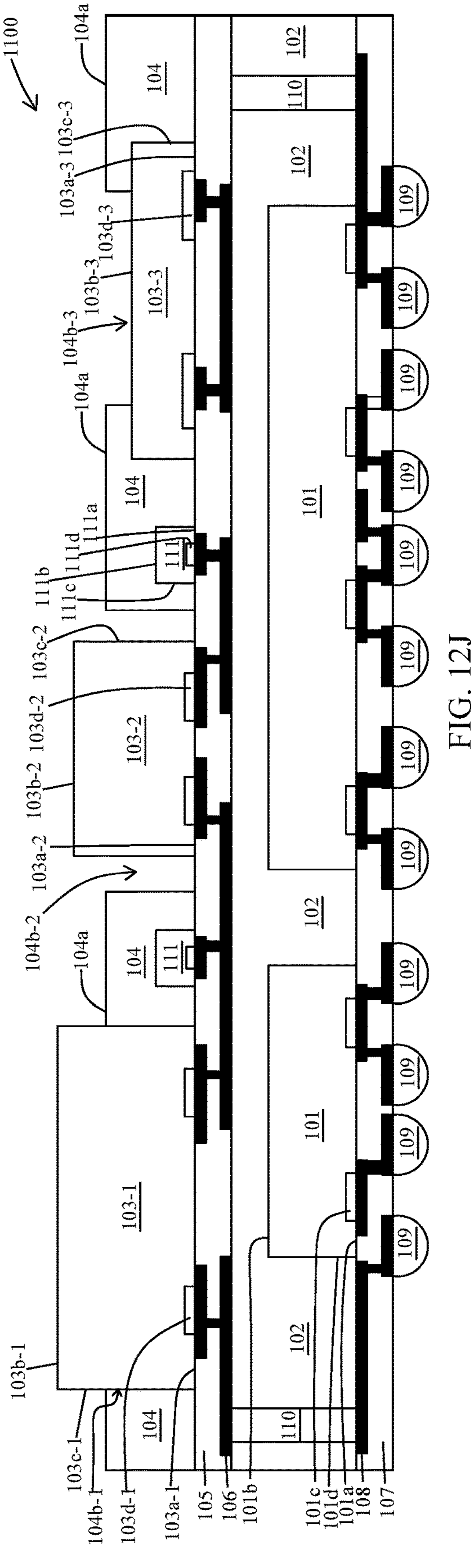

In some embodiments as shown in FIG. 12J, the carrier 112 is removed, and a second dielectric layer 107 and a second interconnect structure 108 are formed over the first molding 102 and the top surface 101*a* of the first die 101. In some embodiments, the second dielectric layer 107 is disposed by spin coating, chemical vapor deposition (CVD) or any other suitable operations. In some embodiments, the second interconnect structure 108 is disposed within the second dielectric layer 107. In some embodiments, the second dielectric layer 107 is patterned by photolithography and etching operations.

In some embodiments, the second interconnect structure 108 is formed by removing a portion of the second dielectric layer 107 and then disposing a conductive material. In some embodiments, the conductive material is disposed by electroplating, electroless plating or other suitable operations. In some embodiments, the second interconnect structure 108 is electrically connected to the conductive via 110. In some embodiments, a portion of the second interconnect structure 108 is exposed from the second dielectric layer 107. In some embodiments, the second dielectric layer 107 and the second interconnect structure 108 have similar configurations as described above or illustrated in any one of FIGS. 1-11.

In some embodiments as shown in FIG. 12J, a connector 109 is disposed under a portion of the second interconnect structure 108 to electrically connect to the second interconnect structure 108. In some embodiments, the connector 109 is disposed by ball dropping, solder pasting, stencil printing or other suitable operations. In some embodiments, the connector 109 has similar configuration as described above or illustrated in any one of FIGS. 1-11. In some embodiments, a semiconductor structure 1100 is formed. In some embodiments, the semiconductor structure 700 has similar configuration as the semiconductor structure 700 illustrated in FIG. 11.

In the present disclosure, a semiconductor structure with improvement is disclosed. The semiconductor structure includes a die or a package at least partially exposed from a molding. A predetermined portion of a surface of the die or a predetermined surface of the die is exposed from the molding. The die with exposed portion or exposed surface facilitates predetermined sensing function.

In some embodiments, a method of manufacturing a semiconductor structure is provided. The method includes following operations. A first die is provided. A first molding is formed to encapsulate the first die. A second die is disposed over the first molding. A mold chase is disposed over the second die and the first molding. In some embodiments, the mold chase includes a protrusion protruded from the mold chase towards the first molding. A molding material is disposed between the mold chase and the first molding. A second molding is formed to surround the second die. The second die is at least partially covered by the second molding. The disposing of the mold chase includes surrounding the protrusion of the mold chase by the molding material.

In some embodiments, a semiconductor structure is provided. The semiconductor structure includes a first dielectric layer, a first die, a second die, a first molding, and a second molding. The first die is disposed under the first dielectric layer, and has a first surface facing the first dielectric layer and a second surface opposite to the first surface. The second die is disposed over the first dielectric layer, and has a third surface facing the first dielectric layer and a fourth surface opposite to the third surface. The first molding encapsulates the first die. The second molding is disposed over the first die and the first dielectric layer. The first surface of the first die and the third surface of the second die are in contact with the first dielectric layer. The fourth surface of the second die is partially exposed through the second molding and partially covered by the second molding.

In some embodiments, a semiconductor structure is provided. The semiconductor structure includes a first die, a second die, a dielectric layer and an interconnect structure between the first die and the second die, a first molding, and a second molding. The first die and the second die are electrically connected by the interconnect structure. The first molding is in contact with a sidewall of the first die. The second molding is in contact with sidewalls of the second die. A first portion of a top surface of the second die is covered by the second molding, and a second portion of the top surface of the second die is exposed through the second molding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure comprising:

a first dielectric layer;

a first die disposed under the first dielectric layer and having a first surface facing the first dielectric layer and a second surface opposite to the first surface;

a second die disposed over the first dielectric layer and having a third surface facing the first dielectric layer and a fourth surface opposite to the third surface, wherein the second die includes a sensor;

a first molding encapsulating the first die; and a second molding disposed over the first die and the first dielectric layer, wherein the first surface of the first die and the third surface of the second die are in contact with the first dielectric layer, the first molding contacts an entirety of the second surface of the first die, an outer edge of the first dielectric layer is level with an outer edge of the second molding and an outer edge of the first molding, and the fourth surface of the second die is partially exposed through the second molding and partially covered by the second molding, wherein a portion of the fourth surface of the second die over the sensor is exposed.

2. The semiconductor structure of claim 1, wherein the first die comprises a first sidewall between the first surface and the second surface, and the first sidewall and the second surface are in contact with the first molding.

3. The semiconductor structure of claim 1, further comprising a second dielectric layer under the first die, wherein the first die is separated from the second dielectric layer by the first molding.

4. The semiconductor structure of claim 3, further comprising a first interconnect structure in the first dielectric layer and electrically connected to the first die and the second die.

5. The semiconductor structure of claim 4, further comprising a second interconnect structure in the second dielectric layer and electrically connected to the first interconnect structure.

6. The semiconductor structure of claim 5, further comprising a conductive via extending through the first molding and electrically connecting the first interconnect structure and the second interconnect structure.

7. The semiconductor structure of claim 1, wherein a thickness of the second molding is greater than a thickness of the second die.

8. The semiconductor structure of claim 1, wherein the second molding is free of an interconnect structure.

9. A semiconductor structure comprising:

a first die and a second die, wherein the first die has a first surface and a second surface opposite to the first surface, wherein the second die includes a sensor;

a dielectric layer and an interconnect structure between the first die and the second die, wherein the first die and the second die are electrically connected by the interconnect structure, wherein the dielectric layer has a constant width, wherein the first surface of the first die is in contact with the dielectric layer, wherein the second die has a bottom surface in contact with the dielectric layer, wherein the dielectric layer is solid from an uppermost surface of the dielectric layer to a lowermost surface of the dielectric layer;

a first molding in contact with a sidewall of the first die, wherein an entirety of the second surface of the first die is in contact with the first molding; and a second molding in contact with sidewalls of the second die, wherein a first portion of a top surface of the second die is covered by the second molding, and a second portion of the top surface of the second die is exposed through the second molding, wherein the second portion is aligned with the sensor of the second die.

10. The semiconductor structure of claim 9, wherein the second portion of the top surface of the second die is surrounded by the first portion of the top surface of the second die.

11. A package comprising:

a first semiconductor die, the first semiconductor die comprising a first insulating layer;

a second semiconductor die, the second semiconductor die comprising a second insulating layer, wherein the second semiconductor die includes a sensor;

a first redistribution structure between the first semiconductor die and the second semiconductor die, the first redistribution structure comprising conductive features that electrically couple the first semiconductor die to the second semiconductor die, the first redistribution structure contacting the first insulating layer of the first semiconductor die and the second insulating layer of the second semiconductor die, the first redistribution structure having a constant width, wherein the first redistribution structure is free of solder and underfill, wherein no active devices are positioned between a first surface of the first redistribution structure and a second surface of the first redistribution structure, the first surface of the first redistribution structure facing the first semiconductor die, the second surface of the first redistribution structure facing the second semiconductor die;

a first encapsulant surrounding the first semiconductor die, the first encapsulant completely covering a first surface and sidewalls of the first semiconductor die, the first surface of the first semiconductor die facing away from the first redistribution structure; and a second encapsulant surrounding the second semiconductor die, wherein the second encapsulant only partially covers a lateral surface of the second semiconductor die, wherein a first portion of the lateral surface of the second semiconductor die is exposed through the second encapsulant, wherein the first portion is aligned over the sensor, the lateral surface of the second semiconductor die being opposite to the first redistribution structure.

12. The package of claim 11, wherein a center region of the lateral surface of the second semiconductor die is exposed through the second encapsulant.

13. The package of claim 11 further comprising:

a second redistribution structure on an opposing side of the first semiconductor die as the first redistribution structure; and a conductive via extending through the first encapsulant, wherein the conductive via electrically couples the conductive features of the first redistribution structure to conductive features of the second redistribution structure.

14. The package of claim 13, wherein the first encapsulant extends between a lateral surface of the first semiconductor die and the second redistribution structure.

15. The package of claim 13, wherein the first encapsulant, the second encapsulant, and the first redistribution structure are co-terminous.

16. The package of claim 13, wherein a sidewall of the second encapsulant extends from a lateral surface of the second encapsulant to the lateral surface of the second semiconductor die.

17. The semiconductor structure of claim 1, wherein the first dielectric layer is continuous from an upper surface of the first dielectric layer to a lower surface of the first dielectric layer.

18. The semiconductor structure of claim 1, wherein a sidewall of the first dielectric layer is continuous and flat from an upper surface of the first dielectric layer to a lower surface of the first dielectric layer.

19. The semiconductor structure of claim 9, wherein a sidewall of the dielectric layer is continuous and flat from an upper surface of the dielectric layer to a lower surface of the dielectric layer.

20. The package of claim 13, wherein the second redistribution structure and the second encapsulant are co-terminous.

* * * * *